United States Patent [19]

Takamine

[11] Patent Number: 4,825,155
[45] Date of Patent: Apr. 25, 1989

[54] X-BAND LOGIC TEST JIG

[75] Inventor: Henry K. Takamine, Gardena, Calif.

[73] Assignee: Hughes Aircraft Company, Los Angeles, Calif.

[21] Appl. No.: 75,714

[22] Filed: Jul. 20, 1987

Related U.S. Application Data

[63] Continuation-in-part of Ser. No. 684,767, Dec. 20, 1984, Pat. No. 4,712,062, and a continuation-in-part of Ser. No. 684,421, Dec. 20, 1984, Pat. No. 4,672,312.

[51] Int. Cl.$^4$ .................. G01R 1/04; G01R 1/073
[52] U.S. Cl. .................. 324/158 F; 324/158 P; 333/17
[58] Field of Search ............ 324/158 P, 158 F; 307/89; 174/35 R, 35 C; 333/12

[56] References Cited

U.S. PATENT DOCUMENTS

| Re. 31,477 | 12/1983 | Marshall | 333/243 |
|---|---|---|---|
| 3,258,724 | 6/1966 | Walsh et al. | 174/35 R |
| 3,596,228 | 7/1971 | Reed, Jr. | 324/158 F |
| 3,638,148 | 1/1972 | Hallford et al. | 333/12 |
| 3,678,385 | 7/1972 | Brimer | 324/158 F |
| 3,866,119 | 2/1975 | Ardezzone et al. | 324/158 F |
| 3,963,986 | 6/1976 | Morton et al. | 324/158 F |
| 3,967,223 | 6/1976 | McAvoy | 333/219 |
| 4,069,453 | 1/1978 | Veenendaal | 324/158 F |
| 4,184,133 | 1/1980 | Gehle | 333/238 |
| 4,283,694 | 8/1981 | Pauker | 333/34 |
| 4,339,628 | 7/1982 | Marcantonio et al. | 174/35 34 |
| 4,506,938 | 3/1985 | Madden | 324/158 F |
| 4,554,505 | 11/1985 | Zachry | 324/158 F |
| 4,560,216 | 12/1985 | Egawa | 324/158 F |
| 4,564,251 | 1/1986 | Hansen et al. | 324/158 F |
| 4,574,235 | 3/1986 | Kelly et al. | 324/158 F |
| 4,593,243 | 6/1986 | Lao et al. | 324/158 F |
| 4,672,312 | 6/1987 | Takamine et al. | |
| 4,689,556 | 8/1987 | Cedrone | 324/158 F |
| 4,707,657 | 11/1987 | Boegh-Petersen | 324/158 F |
| 4,712,062 | 12/1987 | Takamine | |
| 4,739,257 | 4/1988 | Jenson et al. | 324/158 F |

OTHER PUBLICATIONS

"Bridge Connector", by Ubermacher, 166, IBM Tech. Disc Bull., vol. 8, #8, p. 1060.
"Mount for Semiconductor Device" by Frei et al, IBM Tech. Disc. Bull., vol. 8, #8, p. 1060.
J. Fetterolf, "Transmission-Line Methods Speed 1-ns Data Along", Electronic Design, Jun. 21, 1980, pp. 95 thru 99.
Harris Microwave Semiconductor, "GaAs Digital IC Evaluation Kit HMK-11MSI-1" Aug. 1984, Product Data.

*Primary Examiner*—Reinhard J. Eisenzopf
*Assistant Examiner*—W. Burns
*Attorney, Agent, or Firm*—William J. Streeter; A. W. Karambelas

[57] ABSTRACT

A jig (10 is provided for testing high speed integrated circuit devices (52). The jig includes a lead guide (50) for automatically aligning the IC leads (54) with the signal carrying traces (22). The underside of the jig is provided with a grounded pad (30) that enables leadless external components (86) to be easily connected to given leads of the IC under test.

16 Claims, 3 Drawing Sheets

X-BAND LOGIC TEST JIG

CROSS REFERENCE TO RELATED APPLICATIONS

This application is a continuation-in-part application of U.S. Ser. No. 684,767 entitled "Ground Shield Apparatus for Giga-Hertz Test Jig" (now U.S. Pat. No. 4,712,062) and Ser. No. 684,421 entitled "Giga-Hertz Test Jig" (now U.S. Pat. No. 4,672,312), both filed on Dec. 20, 1984 and assigned to the assignee of the present invention.

BACKGROUND OF THE INVENTION

1. Technical Field

This invention relates to test jigs and related equipment for testing integrated circuit devices employing extremely fast data transmission rates.

2. Background

Recent developments in the design and fabrication of integrated circuits have resulted in devices which produce signals which propagate faster than most test equipment is capable of detecting or measuring. Previous generations of high speed digital circuits could be evaluated for switching rise times and other output pulse characteristics by measuring equipment which was able to resolve pulses occurring over time periods lasting only billionths of a second. These intervals, now commonly referred to as nanoseconds, have become relatively long passages of time compared to the intervals spanned by signals generated by state-of-the-art digital circuitry. Transmission lines which convey these signals must now cope with waveforms having periods below the nanosecond range. The transmission of this electrical energy from the signal source to a receiving device poses new and difficult problems which were not encountered with apparatus operating below the one billion cycles per second or gigahertz frequency range.

Distortion caused by transmission pathways is proportional to the switching speed of the signals and to the length of the pathway. A major component of this distortion is due to improper impedance matching. When impedance discontinuities are present in a test circuit configuration, unwanted reflections are created within the transmission pathway which degrade the signal by effectively cancelling out the transfer of energy from the signal source to the receiving circuit. These reflections arise when a signal encounters a sudden change in impedance somewhere along a transmission line. A simple technique which reduces these reflections is shortening the length of the interconnections or spacing the conducting lines more closely, but these two remedies create a concomitant disadvantage, in that they greatly enhance the problem of crosstalk, which is discussed below in detail. In a circuit in which the impedance is perfectly matched, both the source and the load at opposite ends of the transmission pathway match the characteristic impedance of the pathway.

Another type of distortion which corrupts signals is crosstalk. Fields of radiation which are propagated by electrical current flowing through transmission lines can induce currents in other nearby conductors. Both electrostatic and electromagnetic fields can produce unwanted interference in signal conveying transmission lines. A primary coupling mechanism which creates crosstalk is the capacitance between closely spaced conductors. Conductors which are near to each other develop a high mutual capacitance signal frequencies cause an even higher amount of energy to be transferred via capacitive coupling. Conventional shielding, which completely encloses a transmission line within a conductor which is grounded, can reduce a large share of this type of distortion caused by radiation, but extremely high signal frequencies tend to defeat such protective measures. One way to minimize crosstalk is by separating transmission lines by relatively large distances, but design constraints and countervailing sources of distortion which would be proportionally increased by larger line separations militate against using this tactic to reduce this source of noise. Another simple means of reducing crosstalk is to form a helical arrangement of pathways using two common insulated wires which are tightly twisted together. Although the added path length brought about by the winding of the conductors adds time delays and other forms of distortion, radiation from each wire in such a twisted pair substantially cancels that emitted by the other and thus cuts down on crosstalk.

Flat cables comprising insulated, round or flat wires which are bound together to form integrated, ribbon-like strips are also employed in attempts to mitigate crosstalk distortion. Alternating ground wires between the signal carrying lines have been used to reduce crosstalk. The diminution in crosstalk achieved by this technique is directly proportional to the number of ground wires interspersed among the transmission wires.

Techniques which address the problems of impedance mismatches and crosstalk are described by James Fetterolf in an article entitled "Transmission-line Methods Speed 1-ns Data Along" published in the June 21, 1980 edition of *Electronic Design* on pages 95 through 99. This publication is generally concerned with prior art technology which can be employed to construct single layer printed circuit boards in which unreliable jig delays and uncertain propagation times cause severe difficulties in accurately evaluating test equipment.

In U.S. Pat. No. Re. 41,477, Marshall describes a multi-signal transmission line formed of a flat cable having a plurality of generally parallel conductors embedded in a dielectric core material. Marshall asserts that his composite transmission line cable reduces far end line-to-line interference between the signal conductor and adjacent quiet lines.

U.S. Pat. No. 4,283,694 Pauker discloses an impedance matching microstrip network for matching a predetermined impedance to a lower impedance over a wide frequency band. This impedance matching device is used in a Gunn-diode oscillator which is tuned over a wide frequency band by means of a small ball of yttrium-iron garnate which is placed in a static magnetic field.

Gehle discloses a microwave integrated circuit in an assembly having a structurally continuous ground plane of conductive material in U.S. Pat. No. 4,184,133. The microwave integrated circuit substrate is mounted to a carrier or chassis by a layer of dielectric material interposed between the lower surface of the substrate and the carrier.

McAvoy describes a resonant ring transmission line having a high Q mode in U.S. Pat. No. 3,967,223. This invention comprises a resonant ring transmission line coupled to a microstrip transmission line.

None of the preceding inventions solves the problem of the deleterious effects of crosstalk and impedance matching to an extent that would allow for the reliable testing of integrated circuit devices which propagate gigahertz frequency signals. None of the prior art devices provides an effective and relatively inexpensive solution to the electrical distortions described above in detail which plague the operation of currently available test equipment. Such a solution would satisfy a long felt need manifested by the current efforts of the electronics test equipment industry, which continues to attempt to develop measurement systems which can cope with the ever-increasing speed of operation of new integrated circuit devices. The development and manufacture of extremely high speed integrated circuit systems has generated a concomitant need for an invention which is capable of measuring signals from these devices.

Such an invention would ideally be suited to function effectively with many different integrated circuit packaging configurations and would be easily adapted to a variety of automatic test equipment systems. Such an innovative, new test jig would be capable of subjecting a test device to extreme ranges of temperature without causing the degradation of test data. This new test jig would expand the bandwidth of currently available test equipment to the gigahertz range, preferably in excess of 12 gigahertz (X-band) while eliminating the tedious and extremely inconvenient standard practice of subtracting unreliable jig delays from final measured test data values.

SUMMARY OF THE INVENTION

The test jig according to the present invention includes at least one dielectric layer having a centrally located cut-out area in one surface thereof. A plurality of conductive traces have inner ends which terminate adjacent to the cut-out area and radiate outwardly to peripheral portions of the jig where external connectors are coupled thereto. A lead guide is mounted to the cut-out area and serves to orient the integrated circuit (IC) chip such that the leads thereof become aligned with the traces when the IC is placed into the guide. A clamping device is then employed to clamp the IC leads against their respective traces.

In the preferred embodiment, the traces are substantially the same width as the integrated circuit leads thereby improving impedance matching. The lead guide serves to ensure that proper alignment is made even though the signal traces are quite thin.

Certain other features of the present invention include the provision of a jig construction wherein external components can be easily coupled to given IC leads. Preferably, the external component is in a chip (i.e., leadless) form to avoid problems that can be associated with relatively long lead lengths of typical packaged components in highspeed testing. In the disclosed embodiment, the underside of the test jig includes a series of traces similar to the traces on the upper surface. Plated through holes are used to connect the ends of the two sets of traces together. Instead of the cut-out area, however, the underside includes a conductive pad which is coupled to a ground plane in the test jig. External components can be easily connected to given IC leads by mounting them between an appropriate trace on the underside and the conductive pad.

BRIEF DESCRIPTION OF THE DRAWINGS

Various other advantages will become apparent to those skilled in the art upon reading the following specification and by reference to the drawings in which.

DESCRIPTION OF THE PREFERRED EMBODIMENT

Figure 1:
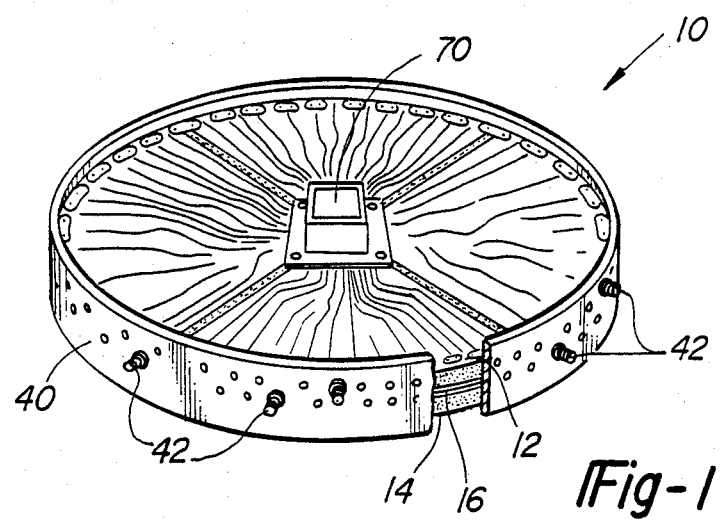
FIG. 1 is a perspective view, with parts broken away, of a test jig made in accordance with the teachings of the present invention.

The test jig 10 of the preferred embodiment includes a disk shaped upper dielectric layer 12 and a lower dielectric layer 14 which sandwich a ground plane 16 therebetween. Ground plane 16 takes the form of a copper sheet which has been affixed to the opposing inner surfaces of the dielectric layers 12 and 14 by suitable adhesives such as pre-preg. Dielectric layers 12 and 14 can be made of any suitable material such as epoxy/glass laminate but it has been found that a ceramic polytetrafluoroethylene composite material provides results which are presently preferred. This latter material is available from Rogers Corporation of Chandler, Ariz. under the mark RT/duroid. This material is commercially available with a copper foil cladding that enables the formation of conductor patterns on surfaces thereof by well known techniques such as photolithographic etching procedures. Using such procedures, the outer most surfaces of the two dielectric layers are provided with a conductor pattern which will be described later herein.

Figure 2:
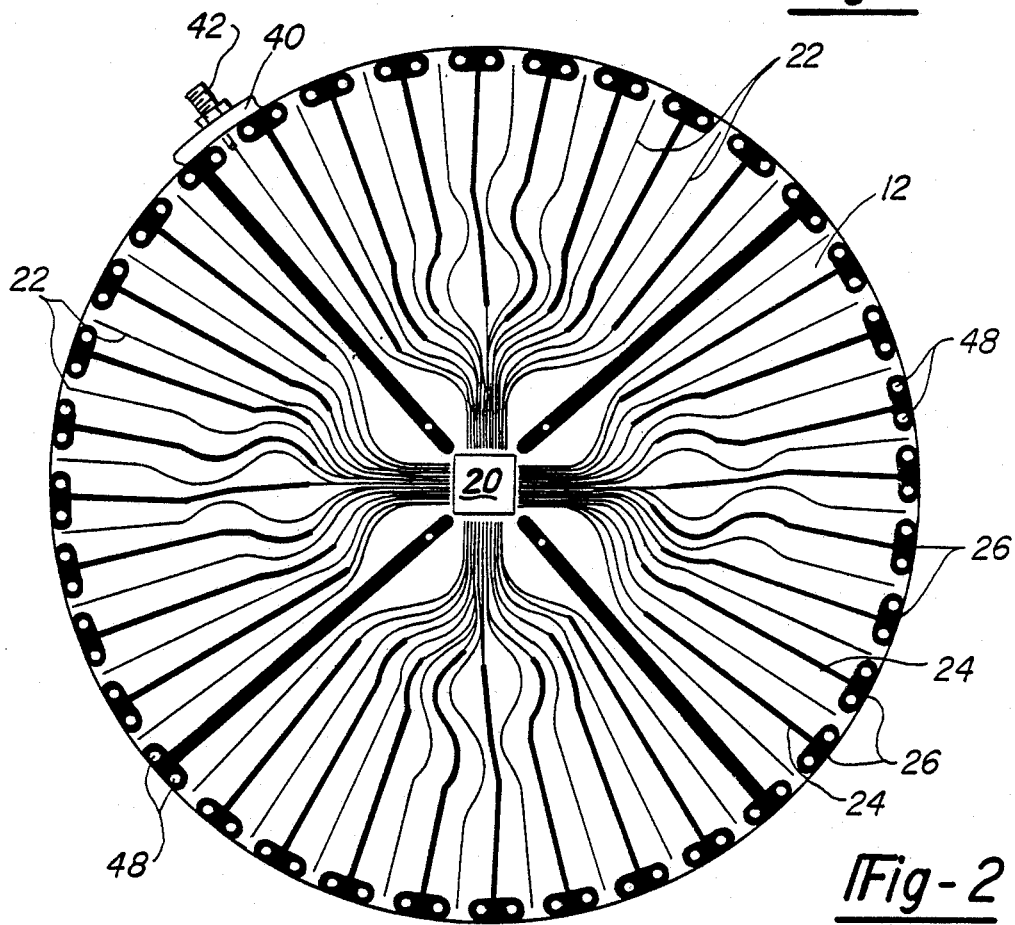
FIG. 2 is a top plan view thereof.

The upper surface of dielectric layer 12 includes a rectangular cut-out portion 20. A plurality of extremely thin signal carrying traces 22 have inner ends which terminate immediately adjacent the edges of the cut-out portion 20. Traces 22 radiate radially outwardly until their outer ends terminate adjacent the periphery of dielectric layer 12 as can be seen most clearly in FIG. 2. Interposed between the signal traces 22 are ground shield strips 24 which radiate from cut-out portion 20 outwardly until they terminate at respective ground tabs 26 spaced about the periphery of the dielectric layer 12. Among the purposes of the ground shield strips 24 is to reduce cross talk between adjacent signal carrying traces 22. The signal traces are chosen so that their widths are substantially the same as the widths of the integrated circuit device to be tested. By way of a non-limiting example, the diameter of the dielectric layer 12 is about 7.21 inches, the signal traces 22 are about 0.0227 inch in width, the ground strips 24 are 0.004 inch in width and the cut-out portion 20 is about 0.55 inch square and 0.023 inch deep.

The entire construction of the test jig 10 is designed to test integrated circuit devices having extremely high transmission rates, preferably those IC's operating with frequencies in the X-band, i.e. above about 12 gigahertz. To this end, careful attention is given to providing excellent electromagnetic and electrostatic shielding, as well as providing a 50 ohm characteristic impedance which has become the industry standard.

Figure 3:
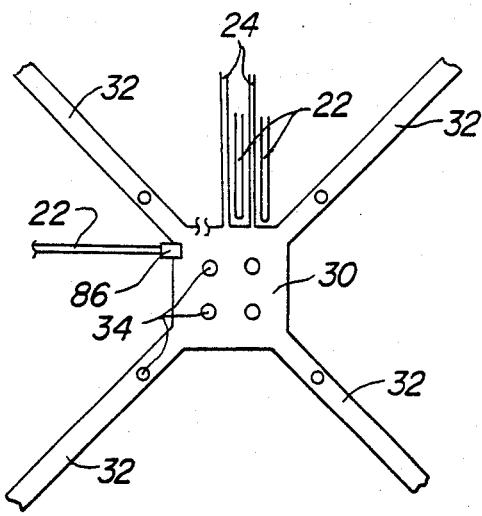
FIG. 3 is a partial bottom view thereof.
Figure 4:
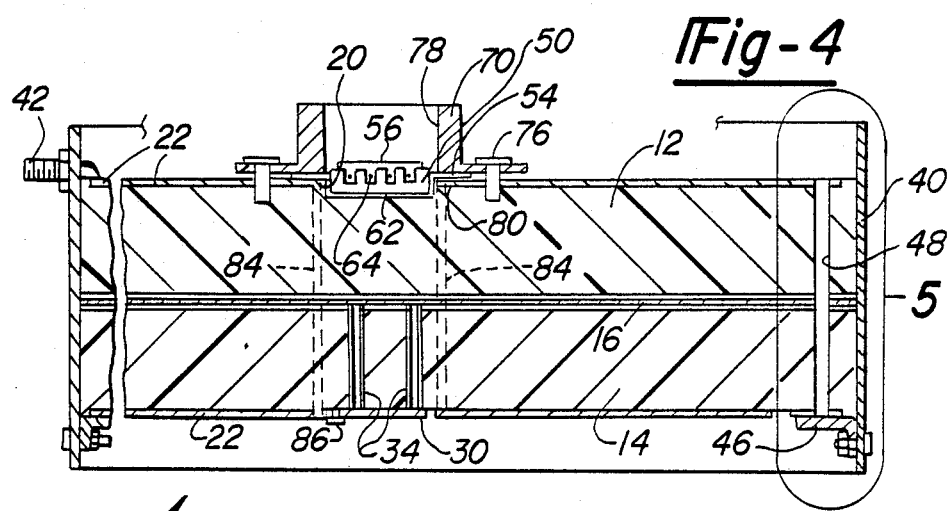
FIG. 4 is a partial cross sectional view thereof.

The conductor pattern on the underside surface of dielectric layer 14 is substantially the same as that of dielectric layer 12 except for the central portion thereof. Instead of the cut-out portion 20, dielectric layer 14 is provided with a centrally located conductive pad 30 which, in this embodiment, is an integral extension of the previously mentioned thin ground shield strips 24, as well as the four thicker ground shield strips 32, as can be best seen in FIG. 3. The inner ends, of signal traces 22 terminate adjacent to, but are spaced from the central pad 30. Provision is made for connecting pad 30 to ground plane 16. This is accomplished in this embodiment by a plurality of plated through holes 34 which extend from the general plane of the pad 30 inwardly to the ground plane 16. Two of the plated through holes 34 are shown in FIG. 4 in cross section. As will appear, this construction enables the tester to apply external leadless components such as capacitors and resistors in chip form to selected leads of the IC under test.

The ground enclosure for the test jig is additionally provided by way of an annular copper outer member 40 having a vertically extending wall through which a plurality of rows of external connectors 42 are mounted. Connectors 42 can be any suitable device having the appropriate characteristics. For example, commercially available miniature RF couplers sold under the trade name OSM connectors from Omni-Spector Company, Inc. can be used. These connectors include a probe which extends through wall 40 and is soldered to individual ones of the traces 22 as can be seen most clearly in FIGS. 2 and 4.

Figure 5:
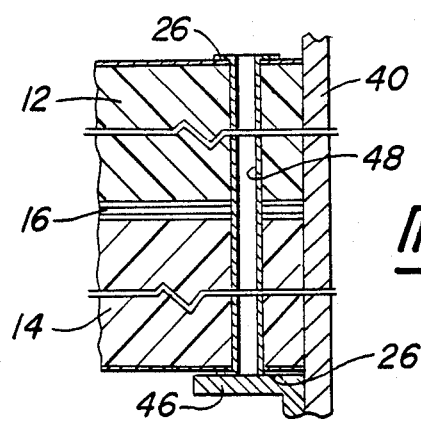
FIG. 5 is an enlarged view taken along the circled area labeled "5" in FIG. 4.

Annular member 40 is physically and electrically connected to ground plane 16, for example, by utilizing an appropriate copper plating on its inner wall that picks up the ground plane. Conductive angle brackets 46 connect the member 40 to the ground tabs 26. The ground tabs 26 are, in turn, connected to the ground plane 16 by way of a plurality of plated through holes 48 as can be seen most clearly in FIGS. 2, 4 and 5.

Figure 6:
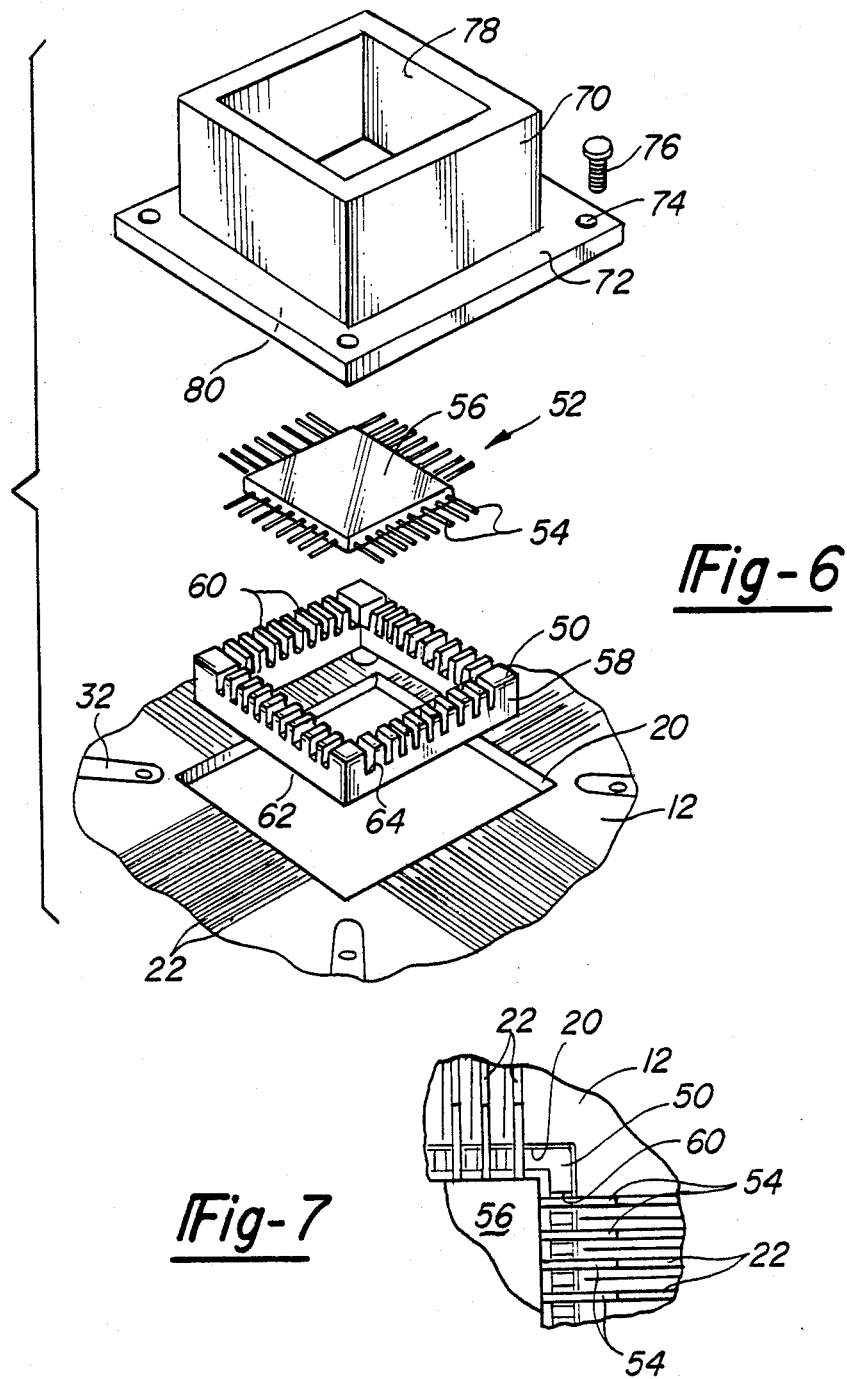
FIG. 6 is an exploded perspective view of parts of the jig.
Figure 7:
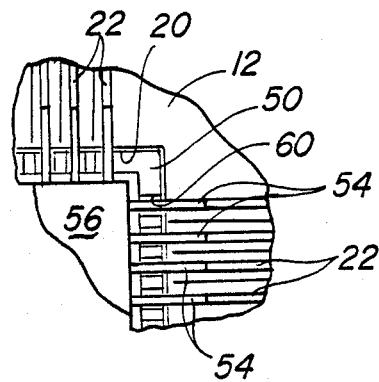
FIG. 7 is a partial top view of the jig showing an IC in place in the lead guide but the clamping member removed.

As can be perhaps seen best in FIG. 6, the test jig 10 includes an IC lead guide 50. Guide 50 serves to orient the integrated circuit device 52 to be tested so that its leads 54 become aligned with the signal traces 22 of the test jig when the body 56 of the IC is placed into the guide 50. In the preferred embodiment, guide 50 takes the form of an annular member having side walls 58 with a plurality of notches 60 therein. The base 62 of the guide is affixed to the bottom of the cut-out portion 20. The depth of the notches 60 are chosen so that the bottoms 64 thereof are substantially coplanar with the signal traces 22 as can be seen most clearly in FIG. 4 where the number of notches have been reduced and enlarged somewhat to simplify the drawings. The lead guide in the preferred embodiment is made of aluminum and coated with an insulative material such as parylene to thereby insulate the guide from the IC leads 54.

To clamp the IC leads 54 onto their respective traces, there is provided a clamping member 70 made of insulating material such as fiberglass. Clamping member 70 has a peripheral ledge 72 with openings 74 therein for receiving fasteners 76 which screw into mating openings in the dielectric layer 12. Clamping member 70 is in the form of an annular member having an inner space 78 for receiving the body 56 of the integrated circuit device 52. The underside of ledge 72 provides a clamping surface 80 of sufficient dimension to mate with the integrated circuit leads 54.

Provision is made for connecting the inner ends of the traces 22 on the dielectric layers 12 and 14 together. This is accomplished by way of a plurality of plated through holes 82 (FIG. 4) which extend through the dielectric layers 12 and 14 and are spaced from the ground plane 16.

In typical use, the operator will place the body of the IC 52 desired to be tested into the lead guide 50. The notches 60 serve to automatically orient the IC such that the leads 54 become aligned with their respective traces 22. This automatic alignment feature is especially advantageous due to the extremely thin nature of the traces 26 and the need to avoid contacting the ground strips 24 interposed therebetween. After the IC is in place, the clamping member 70 is placed over the IC and held into place by tightening fasteners 76. This action causes the clamping surface 80 to clamp the IC leads 54 against their respective traces 22.

A particularly advantageous feature of this invention is the ability to easily add passive chip components to the test jig without using deleterious lead lengths. It is often desirable to connect capacitors or resistors to certain leads of the integrated circuit device 56 to perform certain testing operations. However, if these components were used in their "packaged form" (i.e., having substantial metallic leads extending therefrom) the frequency response of the fixture can be degraded. According to the present invention these components can be used in their chip (i.e., leadless) form to thereby improve the frequency response of the fixture. One such chip 86 is shown in FIGS. 3 and 4. One portion of the chip 86 is connected to a given signal trace 22 whereas an opposite side of the chip 86 is connected to the ground pad 30. It will be appreciated that this action also serves to couple the chip 86 to the IC lead 54 that is clamped to the signal trace 22 connected to its associated signal trace on the underside of the test jig by way of the plated through hole 84. Since the two essentially symmetrical signal trace patterns on dielectric layers 12 and 14 provide two pathways to a given IC lead 54, one trace on a given dielectric layer can be used to apply signals to a given IC lead whereas the other signal trace on the other dielectric layer can be used to read signals therefrom. The application of test signals to the integrated circuit device and the read out of the resultant IC signals can be accomplished by way of external test equipment (not shown) suitably connected to the external connectors 42.

In view of the foregoing, those skilled in the art can appreciate that the present invention provides a test jig that has a wide variety of advantages including being capable of operating at extremely high operating speeds. It should be understood that while this invention has been described in connection with one particular example that the skilled practitioner will realize that other modifications can be made without departing from the spirit of the invention after studying the specification, drawings and following claims.

What is claimed is:

1. A test jig for testing an integrated circuit device having a body and a plurality of leads extending radially therefrom, said test jig comprising:
   a first dielectric layer having a substantially centrally located cut-out portion in a surface thereof;
   a plurality of conductive signal carrying traces having inner ends terminating adjacent to said cut-out portion and outer ends located on peripheral portions of said dielectric layer;
   guide means in the cut-out portion for receiving the leads and orienting the integrated circuit device such that the leads thereof become aligned with and rest on the signal traces when the device is placed into the guide; and clamping means for clamping the leads of the integrated circuit device to the signal traces.

2. The test jig of claim 1 wherein said signal traces are substantially the same width as the width of the integrated circuit device leads thereby facilitating impedance matching.

3. The test jig of claim 1 which further comprises:
a second dielectric layer having a plurality of signal traces on an underside surface thereof;
ground plane means sandwiched between said first and second dielectric layers, adapted to provide an electrical reference level;
a metallic annular member surrounding said dielectric layers and ground plane;
connector means mounted to said annular member and electrically connected to outer ends of said signal traces.

4. The test jig of claim 3 wherein said ground plane means comprises a metallic sheet substantially coextensive with the dielectric layers.

5. The test jig of claim 3 which further comprises:
means for connecting inner ends of corresponding traces on the first and second dielectric layers together thereby providing two pathways which can be coupled to a lead of the integrated circuit device.

6. The test jig of claim 5 wherein said means for connecting comprises plated through holes extending through the first and second dielectric layers.

7. The test jig of claim 3 wherein said underside surface of the second dielectric layer includes a centrally located conductive pad; and
means for electrically connecting the pad to said ground plane whereby external components can be coupled to a given lead by mounting the component between a given trace on the second dielectric layer and said pad.

8. The test jig of claim 1 wherein said guide means comprises:
an annular member having peripheral side walls and a base attached to the cut-out portion, said walls of the annular member having a plurality of notches formed therein for receiving the integrated circuit device leads.

9. A test jig for testing integrated circuit devices having a body and a plurality of leads extending radially therefrom said jig comprising:
a metallic sheet serving as a ground plane;
a first substantially coextensive dielectric layer on one surface of said ground plane, the first dielectric layer having a cut-out portion formed in an outer surface thereof, the first dielectric layer further including a plurality of signal traces having inner ends which terminate substantially adjacent to the cut-out portion, with the signal traces radiating outwardly to peripheral portions of said dielectric layer;
a second substantially coextensive dielectric layer on an opposite surface of the ground plane, said second dielectric layer having a plurality of signal traces on an underside surface, with inner ends of the traces terminating at a centrally located area and radiating outwardly to peripheral portions of the second dielectric layer;
a metallic annular member surrounding said ground plane and dielectric layers, the annular member having a wall which extends generally transverse to said dielectric layers and ground plane;
ground shield means including conductive strips interposed between the signal traces on the dielectric layers;
means for connecting the ground shield means to said ground plane;
a plurality of external connectors mounted in the wall of the annular member, each connector being coupled to a given trace on one of the dielectric layers;
guide means in the cut-out portion of the first dielectric layer, adapted to receive the leads and orient the integrated circuit device such that the leads thereof become aligned with and rest on the traces when the integrated circuit device is placed into the guide means; and
clamping means for clamping the integrated circuit leads onto their respective signal traces.

10. The test jig of claim 9 wherein said guide means comprises:
an annular member having a plurality of peripheral side walls and a base attached to the cut-out portion, the side walls having a plurality of notches formed therein for receiving the integrated circuit leads, the notches having a depth such that the bottom of the notches are substantially coplanar with the signal traces on the first dielectric layer.

11. The test jig of claim 10 wherein the underside surface of the second dielectric layer further includes:
a centrally located conductive pad surrounded by inner ends of said signal traces thereon; and
means for electrically connecting said pad to said ground plane sheet.

12. The test jig of claim 11 which further comprises:
means for electrically connecting inner ends of the signal traces on the first and second dielectric layers together.

13. The test jig of claim 12 wherein outer ends of the ground shield strips terminate in discrete tabs located about the periphery of the dielectric layer; and wherein:
a plurality of plated through holes electrically connect said tabs to the ground plane.

14. The test jig of claim 13 wherein each of said signal traces is substantially the same width as said integrated circuit device leads.

15. The test jig of claim 14 wherein said clamping member comprises:
an annular member having an inner space for receiving the body of the integrated circuit device and a surrounding clamping surface of sufficient dimension to mate with said leads.

16. A test jig for testing an integrated circuit device having a body and a plurality of leads extending therefrom, said test jig comprising:
a first dielectric layer having a substantially centrally located cut-out portion in a surface thereof;
a plurality of conductive signal carrying traces having inner ends terminating adjacent to the cut-out portion and outer ends located on a peripheral portions of said dielectric layer;
guide means in the cut-out portion for orienting the integrated circuit device such that the leads thereof become aligned with the signal traces when the device is placed into the guide;
a second dielectric layer having a plurality of signal traces on an underside surface thereof;

ground plane means sandwiched between said first and second dielectric layers, adapted to provide an electrical reference level;

said underside surface of the second dielectric layer including a centrally located conductive pad;

means for electrically connecting the pad to the ground plane whereby external connectors can be coupled to a given lead by mounting the component between a given trace on the second dielectric layer and said pad;

a metallic member surrounding said dielectric layers and ground plane;

connector means mounted to said member and electrically connected to outer ends of said signal traces; and clamping means for clamping the leads of the integrated circuit to the signal traces on the first dielectric layer.

* * * * *